(12) United States Patent
Haartsen et al.

(10) Patent No.: US 6,400,296 B1
(45) Date of Patent: Jun. 4, 2002

(54) ROBUST CONTINUOUS VARIABLE SLOPE DELTA DEMODULATION

(75) Inventors: Jacobus C. Haartsen, Hardenberg; Jan Stemerdink, Winterswijk, both of (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/716,259

(22) Filed: Nov. 21, 2000

(51) Int. Cl.$^7$ .......................... H03M 3/00; H04B 14/06
(52) U.S. Cl. ...................................... 341/143; 375/247
(58) Field of Search .................. 341/143, 76; 375/240, 375/244, 251, 250, 249, 248, 247; 370/335; 704/230

(56) References Cited

U.S. PATENT DOCUMENTS

| | | | |
|---|---|---|---|
| 3,393,364 A | | 7/1968 | Fine |
| 4,035,724 A | * | 7/1977 | Stephenne et al. .......... 375/251 |
| 4,151,517 A | * | 4/1979 | Kelley ........................ 341/108 |
| 4,264,974 A | | 4/1981 | Crouse |
| 4,646,322 A | * | 2/1987 | Flanagin et al. ............. 375/244 |
| 4,862,173 A | * | 8/1989 | Nishitani .................... 341/200 |
| 5,014,284 A | * | 5/1991 | Langer et al. ............... 375/249 |
| 5,557,635 A | * | 9/1996 | Laird ......................... 375/250 |
| 5,614,904 A | * | 3/1997 | Dent .......................... 341/143 |
| 5,790,062 A | * | 8/1998 | Darnell et al. .............. 341/143 |

OTHER PUBLICATIONS

Jaap Haartsen, "Bluetooth—The Universal Radio Interface for AD HOC, Wireless Connectivity," Ericsson Review No. 3, 1998, pp. 110–117.

V. D. Mytri, et al., "Implementation of a Modified CVSD Coder," International Journal of Electronics, 1987, vol. 62, No. 3, pp. 473–479.

Ching–Long Song, et al., "A Variable–Step–Size Robust Delta Modulator," IEEE Transactions on Communication Technology, Dec. 1971, vol. COM–19, No. 6, pp. 1033–1044.

Yongbin Wei, et al., "A Noise Constrained LMS Algorithm for Fading Channel Communications," 1997 IEEE, pp. 754–757.

S.C. Douglas, et al., "Optimum Error Nonlinearities for LMS Adaptation," 1990 IEEE, pp. 1421–1424.

N.S. Jayant, et al., "Digital Coding of Waveforms, Principles and Applications to Speech and Video" Prentice–Hall Inc., New Jersey, 1984, pp. 410–414.

* cited by examiner

Primary Examiner—Patrick Wamsley
(74) Attorney, Agent, or Firm—Burns, Doane, Swecker & Mathis, L.L.P.

(57) ABSTRACT

A step size is generated for use in a continuous variable slope delta (CVSD) demodulator by determining a likelihood that a group of one or more coded bits includes an erroneous bit. The step size is then generated as a function of the likelihood that the group of one or more coded bits includes an erroneous bit. For example, if the CVSD demodulator requires that the step size be increased, then the step size is increased by a larger amount if the likelihood of error is not greater than a threshold likelihood, and the step size is increased by a lesser amount if the likelihood of error is greater than the threshold likelihood.

30 Claims, 8 Drawing Sheets

ROBUST CONTINUOUS VARIABLE SLOPE DELTA DEMODULATION

BACKGROUND

The present invention relates to communication systems supporting synchronous voice services, more particularly to the use of continuous variable slope delta modulation/demodulation in such systems, and even more particularly to techniques for making continuous variable slope delta modulation-based systems more robust in the presence of interference.

In the last decades, progress in radio and Very Large Scale Integrated Circuit (VLSI) technology has fostered widespread use of radio communications in consumer applications. Portable devices, such as mobile radios, can now be produced having acceptable cost, size and power consumption.

Although wireless technology is today focused mainly on cellular communications, in which a user is connected to a fixed infrastructure via radio base stations and portable handsets, a new area of radio communications is emerging that provides short-range connectivity between nomadic devices like laptop computers, mobile phones, Personal Digital Assistants (PDAs) and digital notebooks. Further advances in technology will provide very inexpensive radio equipment, which can be easily integrated into many devices. This will reduce the number of cables currently use to interconnect devices. For instance, radio communication can eliminate or reduce the number of cables used to connect master devices with their respective peripherals. The aforementioned radio communications will require an unlicenced band with sufficient capacity to allow for high data rate transmissions. A suitable band is the Industrial, Scientific and Medical (ISM) band at 2.45 GHz, which is globally available. The ISM band provides 83.5 MHz of radio spectrum.

By definition, unlicensed bands allow all kinds of radio systems to operate in the same medium. This gives rise to mutual interference. To reduce interference and allow a fair access for every user, signal spreading is usually applied. Spreading provides immunity to other systems to other systems and jammers sharing the band. In fact, the Federal Communications Commission (FCC) in the United States currently requires radio equipment operating in the 2.45 GHz band to apply some form of signal spreading when the transmit power exceeds about 0 dBm. Spreading can either be at the symbol level by applying a direct-sequence (DS) spread spectrum technique, or at the channel level by applying a frequency hopping (FH) spread spectrum technique. The latter is attractive for the radio applications mentioned above because it more readily allows the use of cost-effective radios. A radio interface, called BLUETOOTH™ wireless technology, has recently been introduced to provide pervasive connectivity, in particular, between portable units like mobile phones, laptop computers, PDAs, and other nomadic devices. The BLUETOOTH™ system applies frequency hopping to enable the implementation of lowpower, low-cost radios having small physical dimensions ("a small footprint"). The system supports both data and voice services. The latter is optimized by applying fast frequency hopping with a nominal rate of 800 hops per second (hops/s) through the entire 2.45 GHz ISM band in combination with a robust voice coding. An introduction to the BLUETOOTH™ system can be found in "BLUETOOTH—The universal radio interface for as hoc, wireless connectivity," by J. C. Haartsen, Ericsson Review No. 3, 1998.

The default voice coding scheme in the BLUETOOTH™ system is based on Continuous Variable Slope Delta (CVSD) modulation. CVSD modulation is a type of delta modulation. More generally, delta modulation is a waveform coding technique in which an analog signal is sampled and the difference between successive samples (delta step) is represented by a binary word (bit sequence) that is subsequently transferred to the recipient. The coded bits in the delta modulation do not represent an absolute signal level but rather a derivative. In fact, the bits typically only tell the recipient to go one step up (+d) or one step down (−d) with respect to the previous value. FIG. 1 shows a simple example of a conventional delta modulator/demodulator configuration 100. An analog signal is supplied to an input, sampled by a sample and hold circuit 110, and digitized by a digitizer 120. The digital samples are then supplied to a non-negating input of a subtractor 130. A negating input of the subtractor 130 receives a reconstructed signal (image). The subtractor 130 then determines the difference between the supplied digital sample and a sample from the reconstructed signal (image). This difference is supplied to a limiter 140. Only the sign of the difference is of interest. Consequently, the output of the limiter 140 supplies bits 0/1 where, for example, a 0 means that a negative difference was detected and 1 means that a positive difference was detected. The output of the limiter 140 is the output of the delta modulator 180, and is therefore transferred to a delta demodulator 190. Within the delta modulator 180, the output of the limiter 140 is also used to control a feedback circuit that includes an accumulator 150. The output of the limiter 140 indicates whether a step $\delta$ is to be added (bit=1) or subtracted (bit=0) from the value stored in the accumulator 150. The output of the accumulator 150 is the reconstructed signal (image) that is supplied to the negating input of the subtractor 130.

The delta demodulator 190 simply contains an accumulator 160 that stores a value to which either a step $\delta$ is added (if the received input bit=1) or subtracted (if the received input bit=0). Finally, the digitized output of the accumulator 160 is filtered in a low-pass filter 170. The output of the low-pass filter 170 is an analog signal that should substantially resemble the one initially supplied to the sample and hold circuit 110. The modulation and demodulation processes may further contain upsampling and downsampling, but these functions are not shown in order to simplify the explanation of the pertinent details.

The simple delta modulation technique described above does not give acceptable performance when a voice signal is considered. The dynamics in the voice signal are large and it is difficult to find a suitable step size in the delta modulator that is both small enough to hide quantization noise, and large enough to be able to follow large escapes in the voice signal. If the step size is chosen small enough to reduce noise, a phenomenon called "slope overload" typically results, in which the signal reconstructed from the delta values is unable to accurately reproduce the original signal. An example of slope overload is illustrated in the graph of FIG. 2. An original analog signal 201 is shown. The step-wise signal 203 is generated at the outputs of the accumulators 150 and 160. The derivative of the original signal 201 is much larger than the step size in the delta modulator. Consequently, a long sequence of positive or negative delta values is generated, such as the sequence of negative values 205. However, the relatively small step size in the modulator prevents the reconstructed step-wise signal 203 from following the original signal 201.

To avoid slope overload problems, a modification in the delta modulator has been developed in which the step size dynamically changes: If the signal involves large variations, the step size is increased; and if the signal is rather stable, the step size is decreased. In this way, the instantaneous signal-to-quantization noise ratio is kept fairly constant whereas large changes in the signal can be followed. Such a system is referred to as a Continuous Variable Slope Delta (CVSD) modulator, since the step size varies depending on the slopes in the input signal.

A CVSD modulator/demodulator configuration is shown in FIG. 3. An analog signal is supplied to an input, sampled by a sample and hold circuit 110, and digitized by a digitizer 120. The digital samples are then supplied to a CVSD encoder 301. Within the CVSD encoder 301, the digital samples are supplied to a non-negating input of a subtractor 330. A negating input of the subtractor 330 receives a reconstructed signal (image). The subtractor 330 then determines the difference between the supplied digital sample and a sample from the reconstructed signal (image). This difference is supplied to a limiter 340. Only the sign of the difference is of interest. Consequently, the output of the limiter 340 supplies bits 0/1 where, for example, a 0 means that a negative difference was detected and 1 means that a positive difference was detected. The output of the limiter 340 is the output of the CVSD encoder 301, and is therefore transferred to a CVSD decoder 303.

Within the CVSD encoder 301, the output of the limiter 340 is also used to control a feedback circuit that includes an accumulator 350. The output of the limiter 340 is supplied to the accumulator, and controls whether a step δ is to be added (bit=1) or subtracted (bit=0) from the value stored in the accumulator 350. The output of the accumulator 350 is the reconstructed signal (image) that is supplied to the negating input of the subtractor 330.

The CVSD encoder 301 differs from the delta modulator 180 in that it further includes a step size generator 310, which generates a step size based on the signal supplied at the output of the limiter 340. The output of the step size generator 310 is supplied to the accumulator 350, and represents the step δ that should alternatively be added to, or subtracted from, the existing contents of the accumulator 350, as determined by the value supplied by the limiter 340. Thus, instead of a fixed step size δ, as is used in the configuration of FIG. 1, the step size 6 in the configuration of FIG. 2 is varied and depends on the number of 1s or 0s produced in the sequence generated by the limiter 340.

The CVSD decoder 303 is similarly arranged to utilize variable-sized steps. In the exemplary arrangement, the CVSD decoder 303 contains an accumulator 60 that stores a value to which either a step δ is added (if the received input bit=1) or subtracted (if the received input bit=0). The size of the step 6 that is added or subtracted is generated by a step size generator 370, and depends on the sequence of 1s or 0s produced in the sequence generated by the CVSD encoder 301. Finally, the digitized output of the accumulator 360 is filtered in a low-pass filter 170. The output of the low-pass filter 170 is an analog signal that should substantially resemble the one initially supplied to the sample and hold circuit 110. The modulation and demodulation processes may further contain upsampling and downsampling, but these functions are not shown in order to simplify the explanation of the pertinent details.

The use of CVSD technology reduces slope-overload deficiencies described above. This improvement is illustrated in the graph of FIG. 4, which shows the same original analog signal 201 as in FIG. 2, and the improved tracking of the reconstructed step-wise signal 401 generated by the accumulators 350 and 360. The CVSD technique is well-known. For example, a description can be found in "Digital Coding of Waveforms," by N. S. Jayant and P. Noll (Prentice-Hall, Inc. New Jersey, 1984).

The process of varying the step size is also referred to as syllabic companding. The use of syllabic companding improves the voice quality because it more accurately follows the voice signal while not compromising on the Signal-to-Noise Ratio (SNR). But this only holds true for an error-free environment. In an error-prone environment, such as is often encountered in a radio communications environment, the use of syllabic companding makes the signal less robust. This is because errors in the bits to be decoded will not only affect the step sign, but also the step size d. In particular, burst errors (i.e., errors that affect an entire group of bits that are transmitted in sequence) may cause the recipient to erroneously determine the existence of a large slope in the signal, which in turn will cause the step size to be erroneously increased. This, in turn, results in a reconstructed signal having an increased signal level which may be noticeable as clicks and cracks to the listener.

There is, therefore, a need for methods and apparatuses that provide robustness in CVSD demodulators disturbed by bursty interference.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the invention, the foregoing and other objects are achieved in methods and apparatuses that generate a step size for use in a continuous variable slope delta demodulator. This is accomplished by determining a likelihood that a group of one or more coded bits includes an erroneous bit, and then generating the step size as a function of the likelihood that the group of one or more coded bits includes an erroneous bit.

For example, the step size may be increased by a greater amount if the likelihood that the group of one or more coded bits includes an erroneous bit is not greater than a threshold value, whereas the step size may be increased by a lesser amount (or not at all) if the likelihood of an error is greater than the threshold value.

Alternatively, the step size may be increased at a slower rate when errors are likely than is used when errors are not likely.

Combinations of these approaches may also be performed.

In another alternative, a next step size, $\delta_{NEXT}$ may be set in accordance with the following:

$$\delta_{NEXT} = \delta_{PREVIOUS} + \delta_{ERROR}$$

if J of the most recently received K bits are equal to one another, otherwise, $$\delta_{NEXT} = \beta \cdot \delta_{PREVIOUS}$$

wherein:

$\delta_{PREVIOUS}$ is a previous value of the step size;

β is a constant in the range between zero and one;

K is a number greater than one;

J is a number in the range from one to K; and $\delta_{ERROR}$ has a value that is inversely proportional to an error rate associated with the group of one or more coded bits.

In yet another alternative, a next step size, $\delta_{NEXT}$, may be set in accordance with the following:

$$\delta_{NEXT}=\delta_{PREVIOUS}+\delta_{ERROR}$$

if J of the most recently received K bits are equal to one another, otherwise, $$\delta_{NEXT}=\beta \cdot \delta_{PREVIOUS}$$

wherein:

$\delta_{PREVIOUS}$ is a previous value of the step size;

$\beta$ is a constant in the range between zero and one;

$\delta_{ERROR}$ is a number greater than zero;

K is a number greater than one;

J is a number in the range from one to K; and values for K and J are selected as a function of an error rate associated with the group of one or more coded bits. In some embodiments, selecting values for K and J is performed in such a way that a rate at which $\delta_{NEXT}$ increases is inversely proportional to the error rate associated with the group of one or more coded bits. Embodiments utilizing this approach may optionally also give $\delta_{ERROR}$ a value that is inversely proportional to an error rate associated with the group of one or more coded bits.

BRIEF DESCRIPTION OF THE DRAWINGS

The objects and advantages of the invention will be understood by reading the following detailed description in conjunction with the drawings in which.

DETAILED DESCRIPTION

Figure 1:
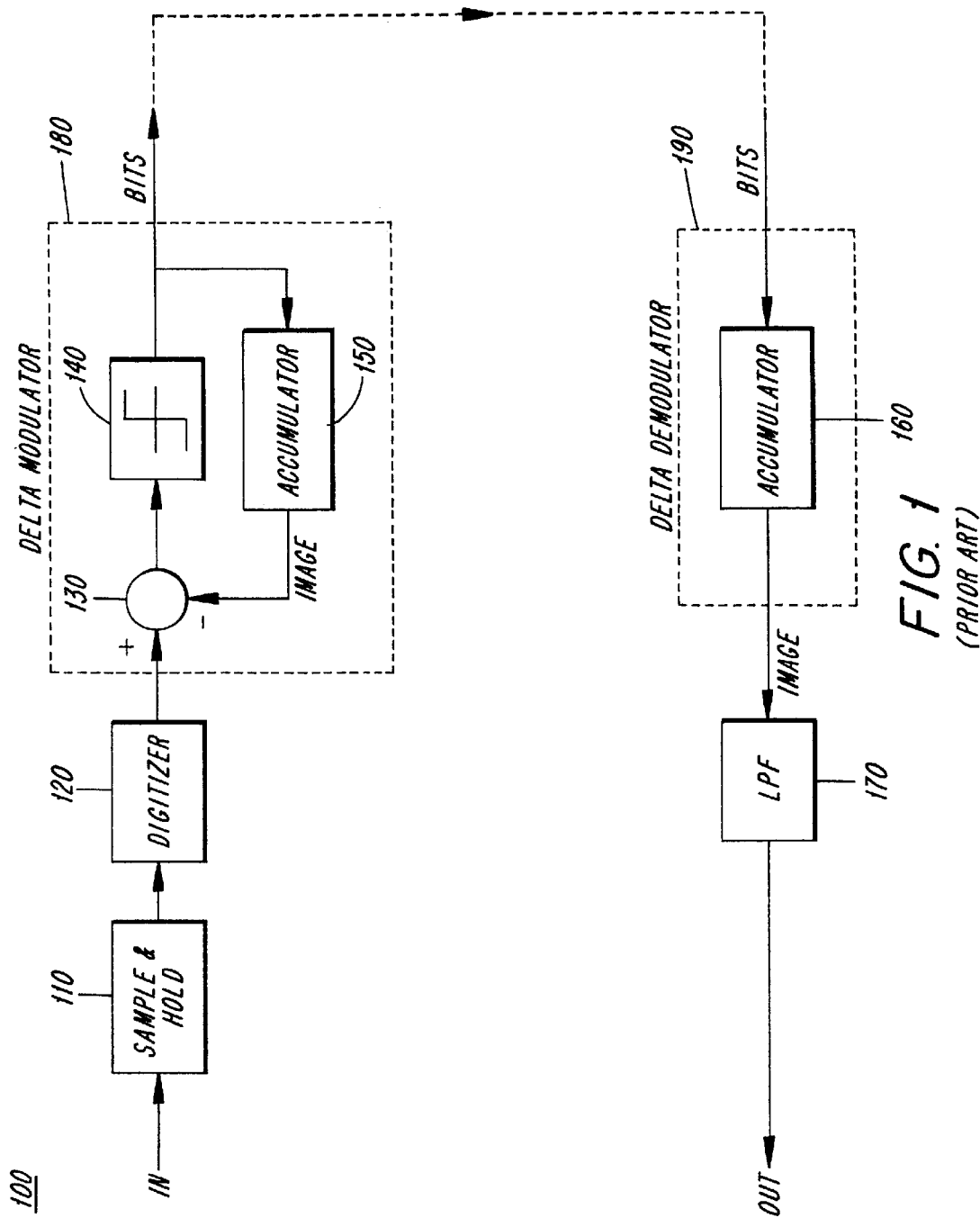
FIG. 1 is a block diagram of a conventional delta modulator/demodulator configuration.
Figure 2:
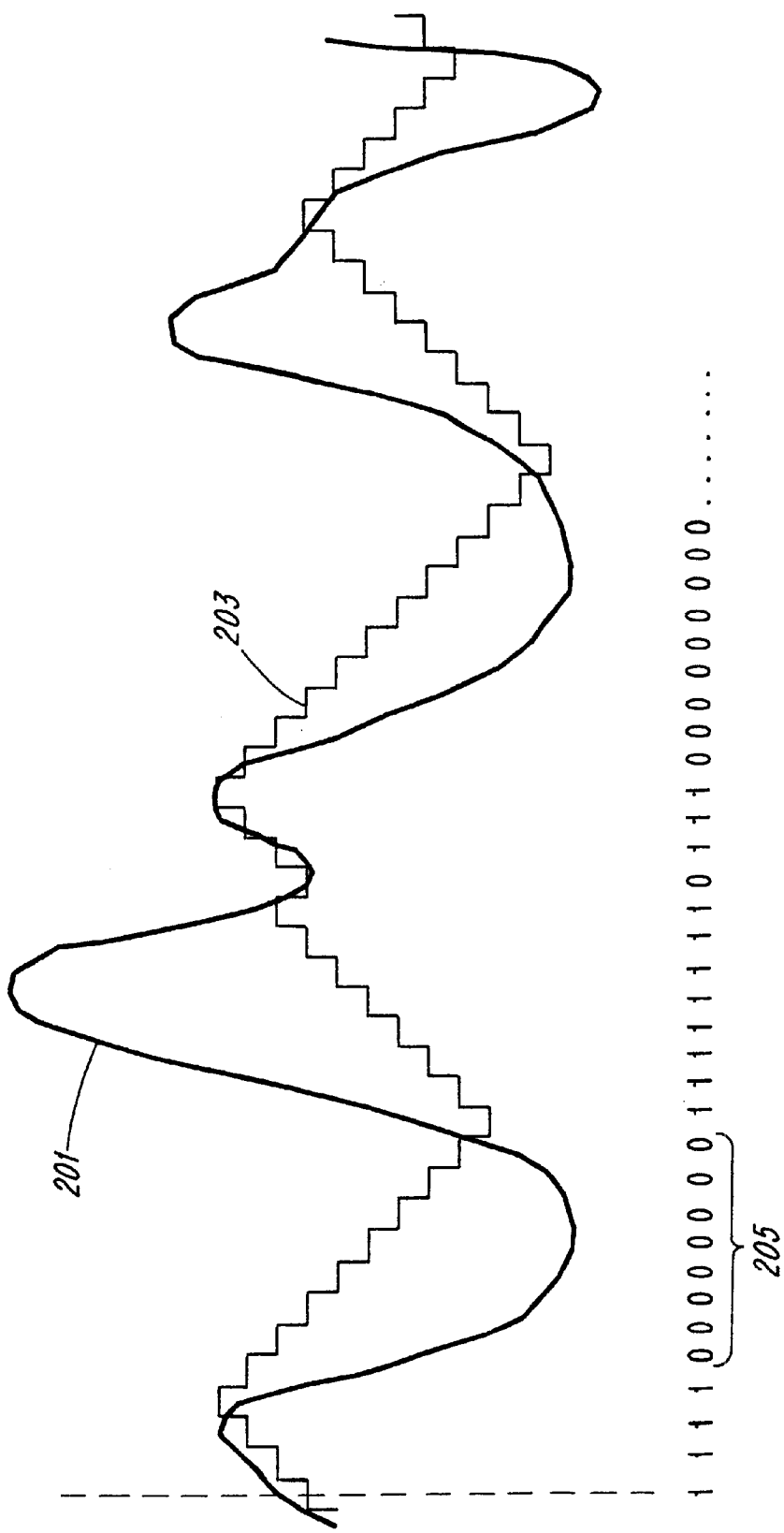
FIG. 2 is a graph of an original analog signal and a reconstructed step-wise signal that exhibits slope overload.

The various features of the invention will now be described with respect to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more programmable processors, or by a combination of both. Moreover, the invention can additionally be considered to be embodied entirely within any form of computer readable storage medium having stored therein an appropriate set of computer instructions that would cause a programmable processor to carry out the techniques described herein. Thus, the various aspects of the invention may be embodied in many different forms, and all such forms are contemplated to be within the scope of the invention. For each of the various aspects of the invention, any such form of embodiment may be referred to herein as "logic configured to" perform a described action, or alternatively as "logic that" performs a described action.

The inventive techniques and apparatuses can improve the quality of CVSD coded voice links in the presence of interference. In accordance with an aspect of the invention, the variations in the step size of a CVSD demodulator are controlled as a function of the error content in a received bit stream. More particularly, analysis of a received bit stream (which analysis may, but need not, include statistical methods) reveals whether, to a certain degree of probability, errors are present. If it is determined that errors are likely to be present, the variation in the step size is restricted.

If it is likely that errors are not present in the received bit stream, the variation in the step size is not bounded. The amount of restriction may depend on the severity of the errors. These and other aspects of the invention will now be described in greater detail below.

Figure 5A:
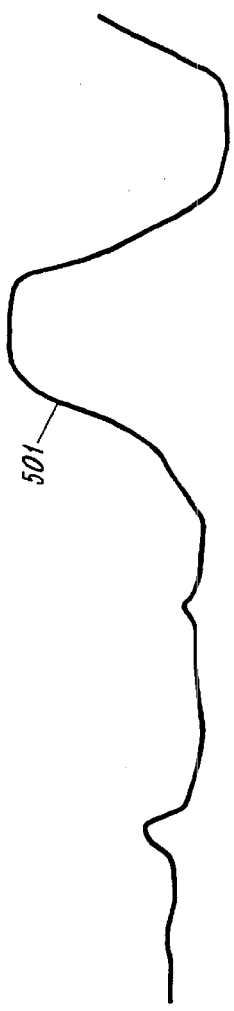
FIGS. 5a, 5b and 5c, are graphs showing, respectively, an original signal, the reconstructed signal without a step size error, and the reconstructed signal having a step size error.
Figure 5B:
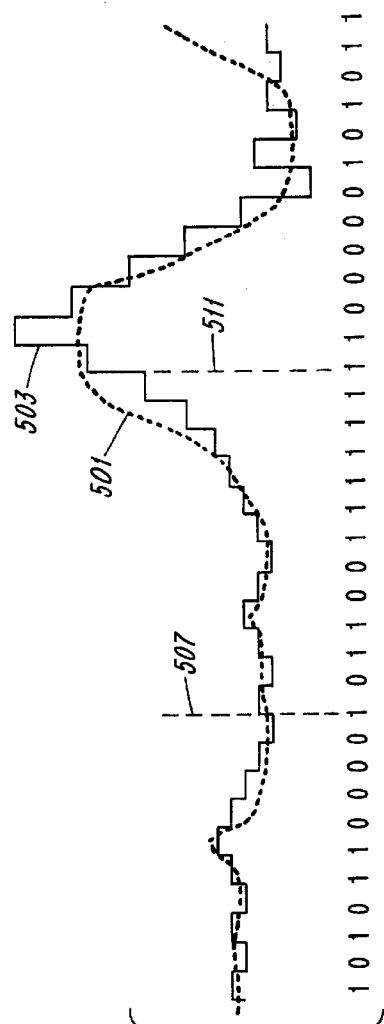
Figure 5C:
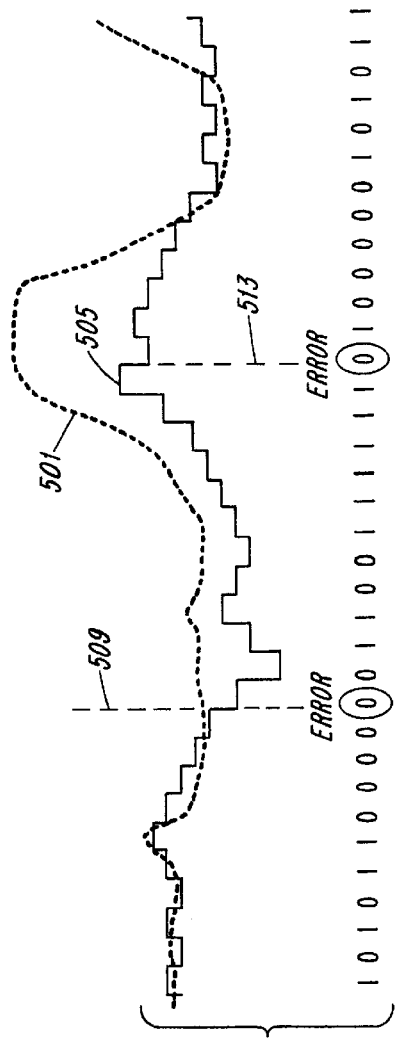

During the last few decades, delta modulation has been used intensively in a number of communications environments, such as in the military. Although delta modulation is not one of the most bandwidth efficient algorithms, it is extremely robust. For example, even when the bit error rate exceeds 20%, the reconstructed voice is understandable (intelligibility) and the speaker can be identified (integrity). Random bit errors in delta modulation are experienced as background noise which intensifies as the bit error rate increases. Therefore, in an error-prone environment with unknown interferers and jammers, delta modulation proves to be very effective when it concerns voice connections. However, as discussed above, basic delta modulation has a problem accurately reconstructing signals that have steep slopes. The use of a variable step size in delta modulation techniques (e.g., in CVSD modulation) is effective for handling steep slopes, but this makes the system more sensitive to errors. Errors in the step size may result in a sudden increase of the signal strength of the reconstructed signal and can then be experienced as clicks or crack in the voice signal. To illustrate this, reference is made to FIGS. 5a, 5b and 5c, which are graphs showing, respectively, an original signal 501, the reconstructed signal 503 without a step size error, and the reconstructed signal 505 having a step size error. It can be seen that, in FIG. 5b, the correctly received "1" bit at 507 not only causes the reconstructed signal 503 to rise, but also breaks the string of successive zeros, so that the step size will not be further increased. By contrast in FIG. 5c, the corresponding erroneous bit "0" received at 509 not only causes the reconstructed signal 505 to erroneously continue its downward trend, but also increases the string of successive zeros, which in turn causes an erroneous increase in step size.

The inverse problem is exhibited later in the sequence. More particularly, it can be seen that, in FIG. 5b, the correctly received "1" bit at 511 not only causes the reconstructed signal 503 to rise, but also increases the string of successive ones, so that the step size is further increased. By contrast in FIG. 5c, the corresponding erroneous bit "0" received at 513 not only causes the reconstructed signal 505 to erroneously start a downward trend, but also breaks the sequence of successive ones, which in turn causes the in step size to be erroneously reduced. Clearly, the errors in FIG. 5c result in erroneously increased and decreased step sizes and therefore (audible) anomalies in the voice signal.

Figure 6:
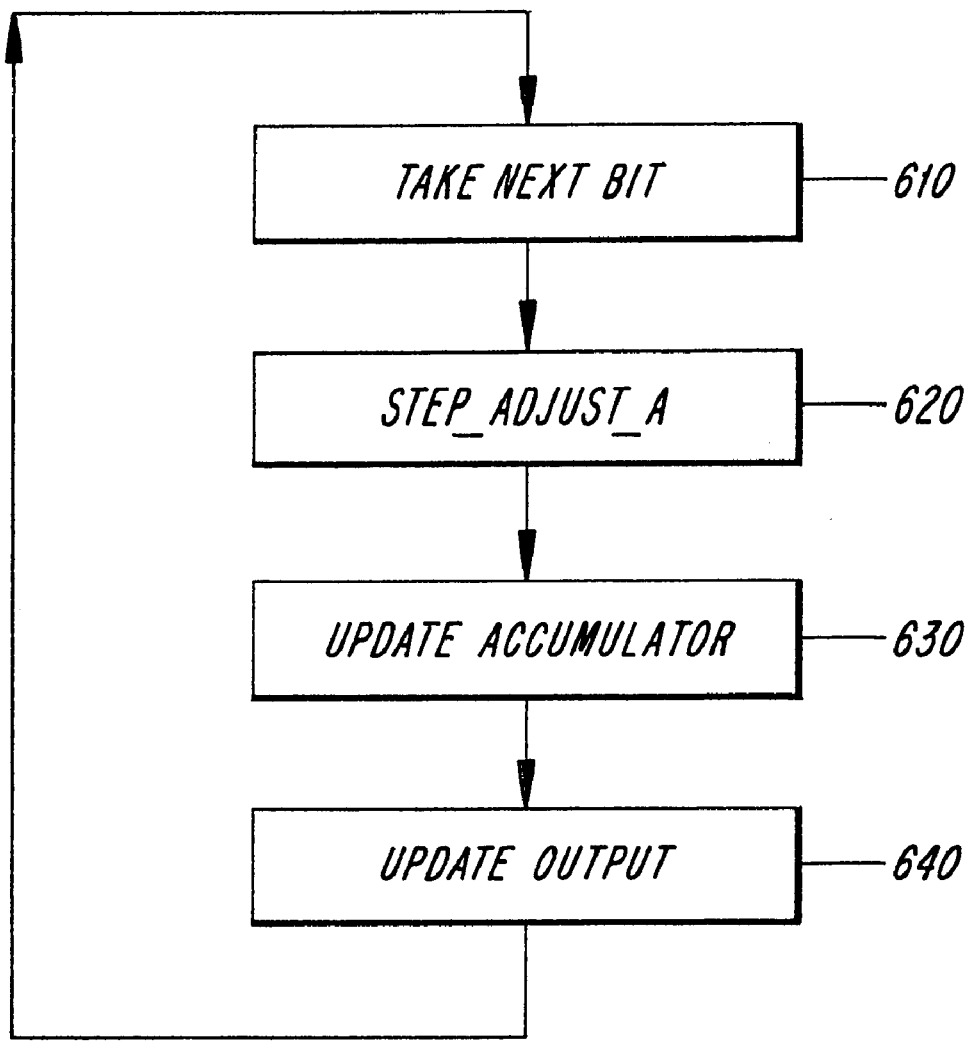
FIG. 6 is a flow chart that depicts the conventional process applied in the CVSD demodulator.

Typically, slope overload is detected by considering the coded bits. If there are many equal bits in a row (indicating continuous up steps or continuous down steps), it is assumed that there is a slope that the reconstructed signal cannot follow. In response, the step size $\delta$ is increased. The reduction of the step size is also based on the coded bits, and is normally implemented as an exponential decay process: If no increments in the step size are requested, the step size is slowly reduced over time to a minimum value, $\delta_{min}$. FIG. 6 is a flow chart that depicts the conventional process applied in the CVSD demodulator. A next coded bit is received (step 610), and used as an input for a first step size adjustment routine (STEP_ADJUST_A) (step 620). STEP_ADJUST_A generates a suitable step size based on the most recently received bit as well as earlier-received bits. Once the step size is determined, the accumulator is updated (step 630) by either adding (e.g., if next bit=1) or subtracting (e.g., if next bit=0) the step size from the previously accumulated value. Following the updating of the accumulator, the output is updated (step 640). In some embodiments, this may mean no more than supplying the output of the accumulator as an output of the CVSD demodulator. However, in practice, the output of the accumulator often determines the output of the demodulator only indirectly because there may additionally be any combination of the following additional processing applied to the output of the accumulator: application of a gain factor (preferably a value close to 1), filtering, and downsampling. The downsampling is often applied because CVSD operation is normally carried out at a higher sampling rate than the sampled voice information (e.g., the voice may be sampled at 8 ksamples/s whereas the CVSD operates at a rate of 64 ksamples/s).

As mentioned earlier, the first step size adjustment routine, STEP_ADJUST_A, includes an algorithm that increases the step size $\delta$ based on the input bit stream. For example, it can carry out the following function:

$$\delta = \delta + \delta_{min} \tag{1a}$$

if J bits in the last K received bits are equal otherwise, $$\delta = \delta \cdot \beta \tag{1b}$$

where $\delta_{min}$, is the minimal step size and $\beta$ is an exponential decay factor ($\beta<1$). The formulas 1a and 1b are not bounded. In practice, $\delta$ is bounded to $\delta_{high}$ at the upper side and to $\delta_{low}$ at the lower side. This bounding is not shown in formulas, but is straightforward to implement, such as by testing to see whether a newly computed value for $\delta$ exceeds the maximum permitted value or is less than a minimum permitted value, and if so, then simply setting $\delta$ equal to the suitable maximum or minimum value. The constants J and K may be set independent of one another. However, typical values for J and K are J=4, K=4.

Figure 3:
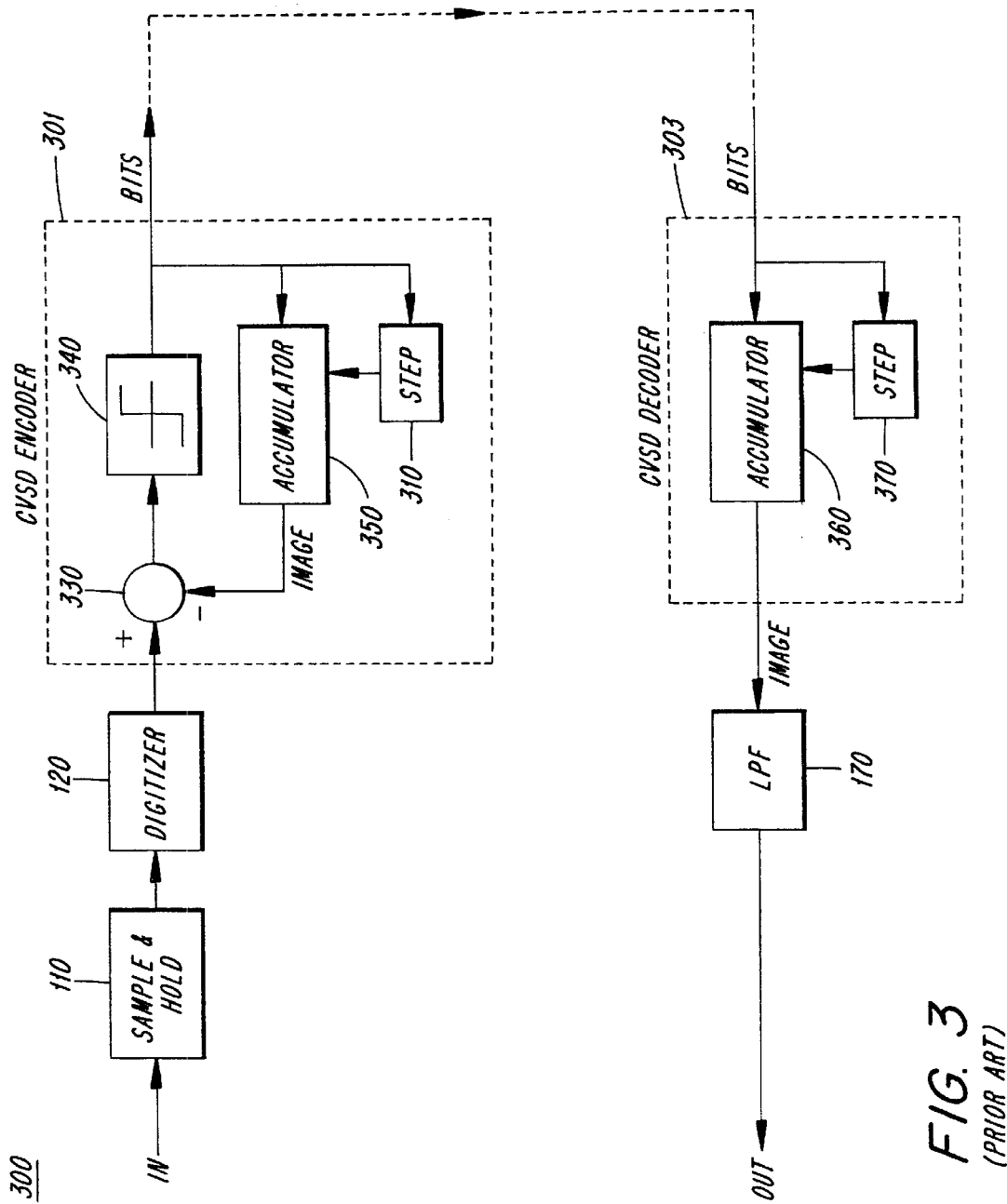
FIG. 3 is a block diagram of a CVSD modulator/demodulator configuration.
Figure 4:
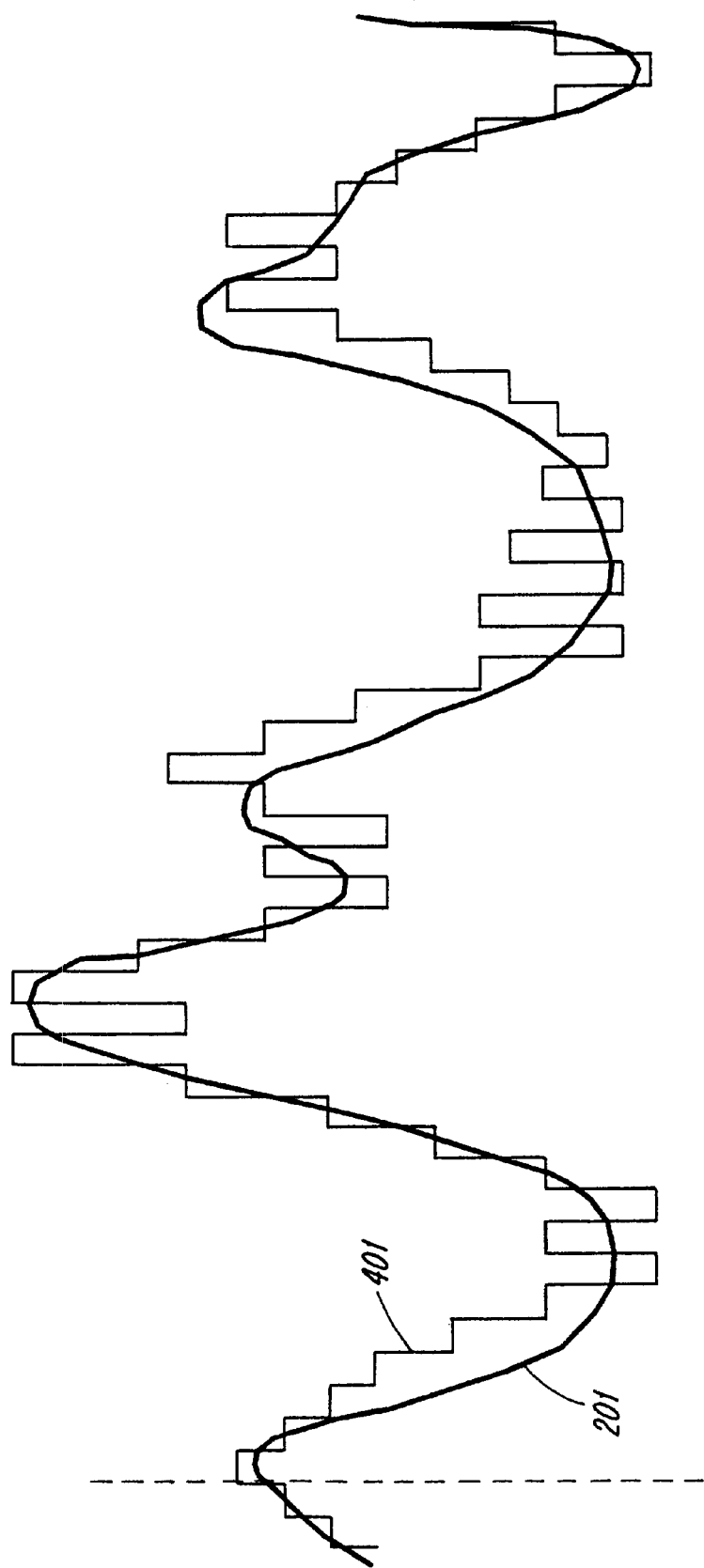
FIG. 4 is a graph of an original analog signal and a reconstructed step-wise signal that shows improved tracking as a result of the use of CVSD technology.
Figure 7:
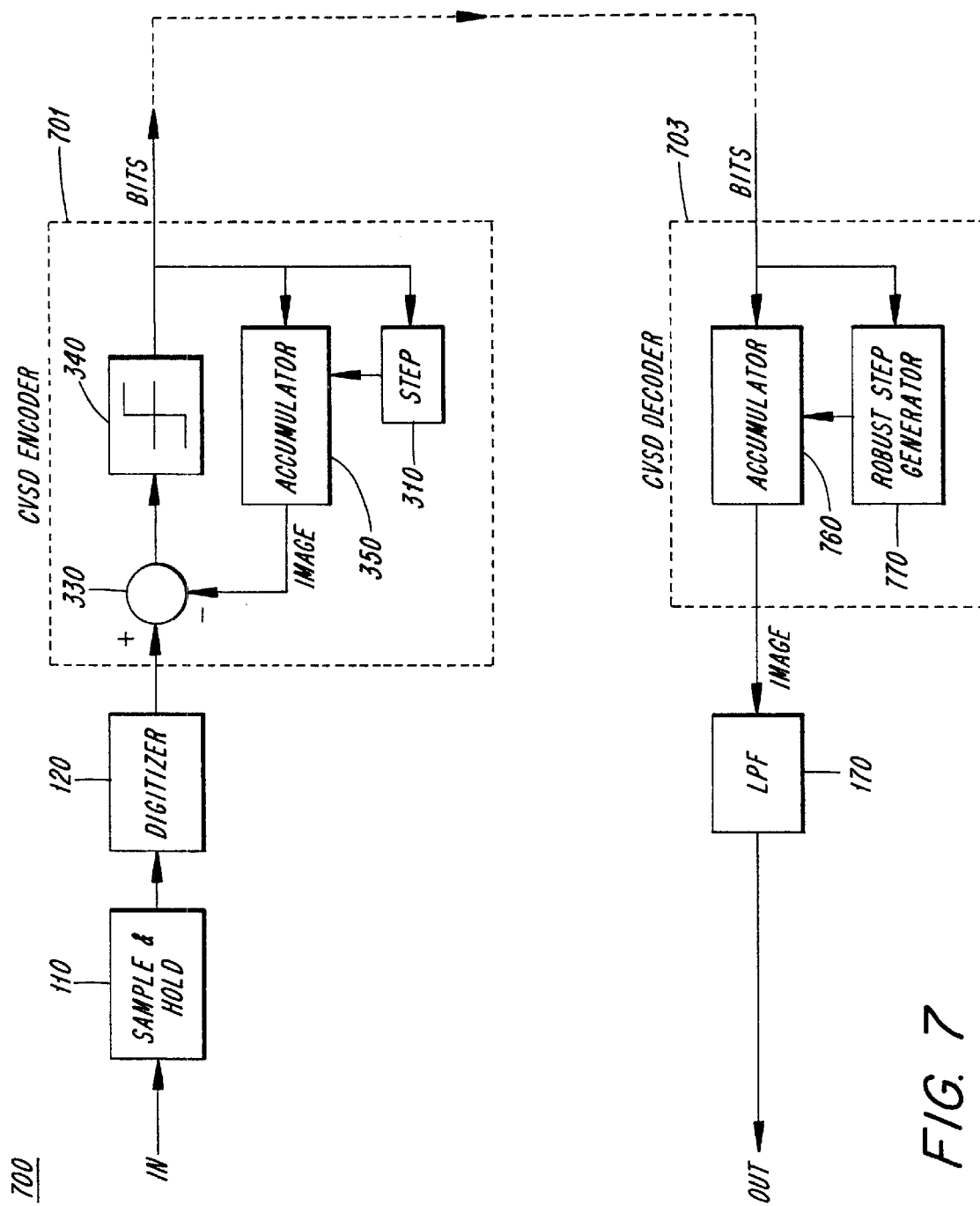
FIG. 7 is a block diagram of a CVSD modulator/demodulator that includes aspects for improving performance in accordance with an aspect of the invention.

The reduction of $\delta$ as indicated by formula 1b is of lesser importance: It only guarantees an optimal SNR when the signal strength is low and the quantization noise is to be minimized. Not having the decay be as quick as ideal when there are errors has only a marginal impact on performance. By contrast, the increase of $\delta$ is much more important. If the received bit stream is expected to contain errors, the increase of $\delta$ must be carried out with caution. Therefore, in accordance with an aspect of the invention, a communications system 700 may have a CVSD encoder 701 and CVSD decoder 703 arranged as shown in FIG. 7. It is expected that the encoder side of the system 700 will not have to contend with errors, and can therefore comprise components identical to those described above with reference to FIG. 3.

The CVSD decoder 703 will have to contend with erroneously received bits, and is therefore configured to include a robust step size generator 770 that generates a step size value, $\delta$, that is supplied to the accumulator 760. The robust step size generator 770 may also be employed in the CVSD encoder 701 in place of the conventional step size generator 310, but as mentioned above, this is not essential since erroneous bits are not expected to be encountered.

Figure 8:
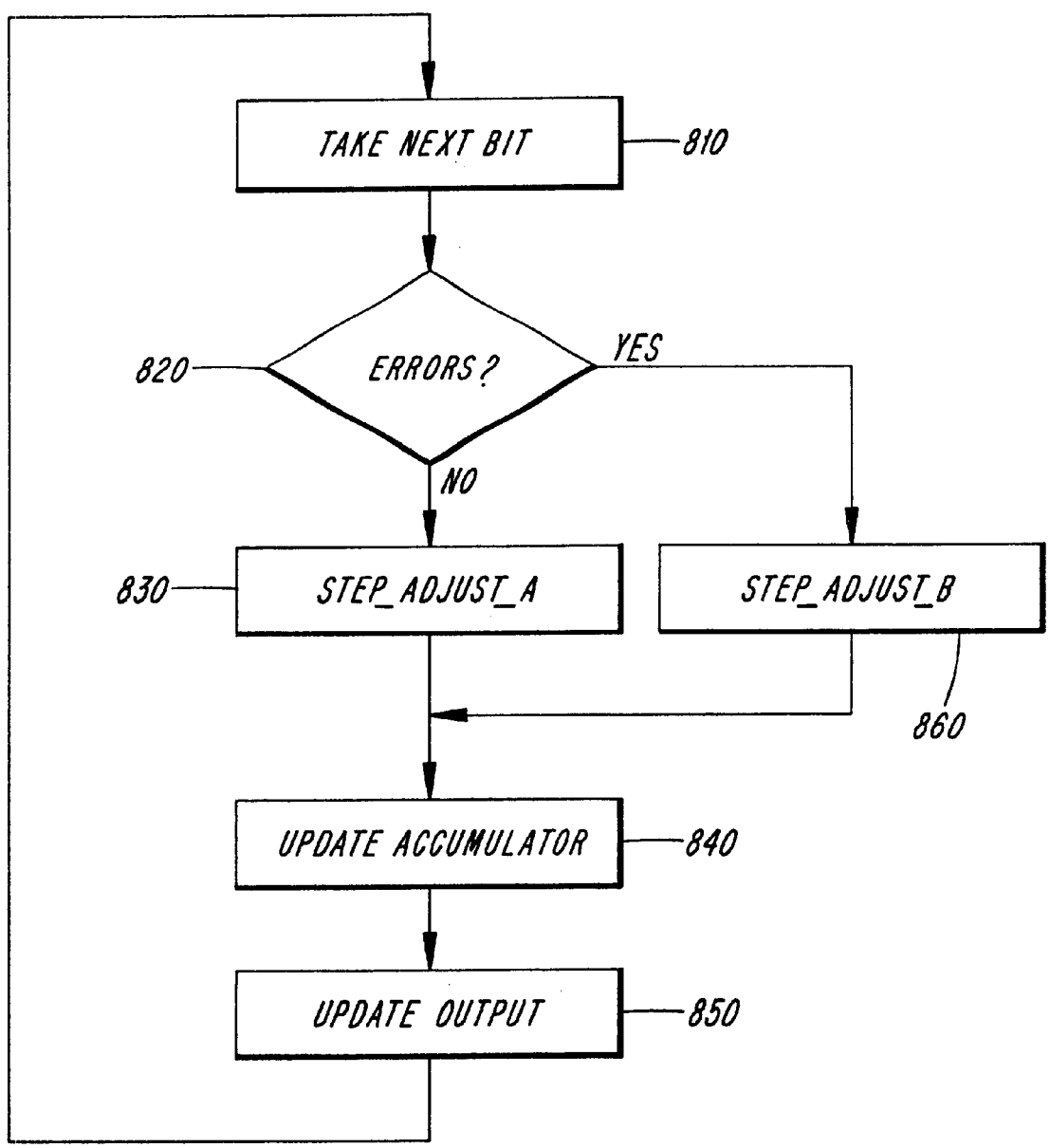
FIG. 8 is a flowchart depicting operation of a robust step size generator in accordance with an aspect of the invention.

In an exemplary embodiment, the robust step size generator 770 is configured to operate in accordance with the flow chart depicted in FIG. 8. After receiving a next coded bit (step 810), a check is performed to determine whether there is a likelihood that it or other recently received bits contain errors (decision block 820). If it is likely that there are no errors ("NO" path out of decision block 820), then the previously described first step size adjustment routine, STEP_ADJUST_A, is performed (step 830). The routine STEP_ADJUST_A can be identical to the conventional procedure, an example of which is shown in equations 1a and 1b.

Following the generation of a suitable step size, the accumulator 760 is updated (step 840) by either adding (e.g., if next bit=1) or subtracting (e.g., if next bit=0) the step size from the previously accumulated value. Following the updating of the accumulator 760, the output is updated (step 850). In some embodiments, this may mean no more than supplying the output of the accumulator as an output of the CVSD demodulator. However, in practice, the output of the accumulator often determines the output of the demodulator only indirectly because there may additionally be any combination of the following additional processing applied to the output of the accumulator: application of a gain factor (preferably a value close to 1), filtering, and downsampling. The downsampling is often applied because CVSD operation is normally carried out at a higher sampling rate than the sampled voice information (e.g., the voice may be sampled at 8 ksamples/s whereas the CVSD operates at a rate of 64 ksamples/s).

Returning to decision block 820, if there is a high probability that there are errors ("YES" path out of decision block 820), then an alternative step size adjustment, STEP_ADJUST_B, is carried out (step 860). The alternative step size adjustment, STEP_ADJUST_B, differs from the first step size adjustment routine, STEP_ADJUST_A, in that it generates a smaller increase in step size than would be generated by the conventional technique. As used herein, the phrase "smaller increase" includes the case where no increase at all is generated, as well as other cases in which a non-zero increase in step size is generated. A number of alternative embodiments of the alternative step size adjustment routine, STEP_ADJUST_B, will now be described.

In a first embodiment, the step size, $\delta$, is kept constant. That is, $\delta=\delta$.

In an alternative embodiment, the step size, $\delta$, is not permitted to increase, but the decay algorithm is still applied:

$$\delta = \delta \tag{2b}$$

if J bits in the last K received bits are equal otherwise $$\delta = \beta \cdot \delta \quad (2b)$$

In still another embodiment, the step size, δ, is permitted to increase as in formula 1 when the received bits all have the same value, but the amount of the increase is not as large:

$$\delta = \delta + \delta_{error} \quad (3a)$$

if J bits in the last K received bits are equal otherwise $$\delta = \beta \cdot \delta \quad (3b)$$

where $\delta_{error} < \delta_{min}$.

In yet another embodiment, the J and K values are chosen differently from the error-free case (preferably larger than in the error-free case):

$$\delta = \delta + \delta_{min} \quad (4a)$$

if L bits in the last M received bits are equal otherwise $$\delta = \beta \cdot \delta \quad (4b)$$

where L≠J and/or M≠K.

Additional embodiments can be derived by making combinations of the last two embodiments as well. That is, one could choose a value for $\delta_{error}$ that is not equal to $\delta_{min}$ and also use L and M values where L≠J and/or M≠K.

It will be understood that by restricting changes in the step size (either directly by keeping δ constant or smaller than $\delta_{min}$, or by slowing down the rate of change by increasing J,K), the syllabic companding is reduced and the system operates closer to a conventional delta modulation scheme. This scheme is known to be robust to bit errors.

One aspect in the robust step size generation is the detection or determination of likelihood of errors. If parity bits are part of the channel protocol, these bits can be used to determine whether there are errors and to quantify how many. Parity bits may be included as Forward-Error-Correction (FEC) coding, or as a Cyclic-Redundancy-Check (CRC) code. If these parity bits are not present, redundancy in the voice waveform may be sufficient to reveal the presence of errors. Statistical analysis may reveal unusual bit patterns which can be marked as erroneous with high probability. For those bit streams, the update procedure STEP_ADJUST_B should be applied.

The robust step size generation may be further enhanced by making the parameters used in the STEP_ADJUST_B procedure dependent on the detected or estimated error rate. For example, the incremental value, $\delta_{error}$, that appears in equation 3a need not be a constant, but may itself be inversely proportional to the detected or estimated error rate. In yet another alternative, the values L and M in formula 4a need not be constants, but may instead be proportional to the detected or estimated error rate. In these alternative embodiments, if the error rate is very low, $\delta_{error}$ is close to $\delta_{min}$ or L,M are close to J,K as used in STEP_ADJUST_A. If the error rate increases, $\delta_{error}$ decreases whereas L and M increase.

The invention has been described with reference to particular embodiments. However, it will be readily apparent to those skilled in the art that it is possible to embody the invention in specific forms other than those of the preferred embodiments described above. This may be done without departing from the spirit of the invention. The preferred embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of generating a step size for use in a continuous variable slope delta demodulator, the method comprising:
    determining a likelihood that a group of one or more coded bits includes an erroneous bit; and
    generating the step size as a function of the likelihood that the group of one or more coded bits includes an erroneous bit.

2. The method of claim 1, wherein the step of generating the step size as a function of the likelihood that the group of one or more coded bits includes an erroneous bit comprises:
    a) if the likelihood that the group of one or more coded bits includes an erroneous bit is not greater than a threshold value, then increasing a previously generated step size by a first amount if J of the most recently received K bits are equal to one another, wherein K is a number greater than zero, and J is a number in the range from one to K; and
    b) if the likelihood that the group of one or more coded bits includes an erroneous bit is greater than the threshold value, then increasing the previously generated step size by a second amount if L of the most recently received M bits are equal to one another, wherein M is a number greater than zero, and L is a number in the range from one to M,
    wherein J, K, L and M have values such that performance of step a) increases the previously generated step size at a faster rate than does performance of step b).

3. The method of claim 2, wherein:
    step a) further comprises reducing the step size by a third amount if J of the most recently received K bits are not equal to one another; and
    step b) further comprises reducing the step size by a fourth amount if L of the most recently received M bits are not equal to one another.

4. The method of claim 3, wherein the third amount is equal to the fourth amount.

5. The method of claim 3, wherein the third amount is not equal to the fourth amount.

6. The method of claim 2, wherein the first amount is equal to the second amount.

7. The method of claim 2, wherein the first amount is greater than the second amount.

8. The method of claim 1, wherein the step of generating the step size as a function of the likelihood that the group of one or more coded bits includes an erroneous bit comprises:
    a) if the likelihood that the group of one or more coded bits includes an erroneous bit is not greater than a threshold value, then increasing a previously generated step size by a first amount; and
    b) otherwise increasing the previously generated step size by a second amount,
    wherein the second amount is less than the first amount.

9. The method of claim 8, wherein the second amount is equal to zero, whereby the previously generated step size is not changed.

10. The method of claim 8, wherein the second amount is greater than zero.

11. The method of claim 8, wherein the steps a) and b) are performed only if J of the most recently received K bits are equal to one another, wherein K is a number greater than zero, and J is a number in the range from one to K, and further comprising:

if J of the most recently received K bits are not equal to one another, then reducing the step size by a third amount.

12. The method of claim 1, wherein the step of generating the step size as a function of the likelihood that the group of one or more coded bits includes an erroneous bit comprises:

setting a next step size, $\delta_{NEXT}$, in accordance with the following:

$$\delta_{NEXT} = \delta_{PREVIOUS} + \delta_{ERROR}$$

if J of the most recently received K bits are equal to one another, otherwise, $$\delta_{NEXT} = \beta \cdot \delta_{PREVIOUS}$$

wherein:

$\delta_{PREVIOUS}$ is a previous value of the step size;

$\beta$ is a constant in the range between zero and one;

$\delta_{ERROR}$ is a number greater than zero;

K is a number greater than one;

J, is a number in the range from one to K; and values for K and J are selected as a function of an error rate associated with the group of one or more coded bits.

13. The method of claim 12, wherein the step of selecting values for K and J is performed in such a way that a rate at which $\delta_{NEXT}$ increases is inversely proportional to the error rate associated with the group of one or more coded bits.

14. The method of claim 12, wherein $\delta_{ERROR}$ has a value that is inversely proportional to an error rate associated with the group of one or more coded bits.

15. The method of claim 1, wherein the step of generating the step size as a function of the likelihood that the group of one or more coded bits includes an erroneous bit comprises:

setting a next step size, $\delta_{NEXT}$, in accordance with the following:

$$\delta_{NEXT} = \delta_{PREVIOUS} + \delta_{ERROR}$$

if J of the most recently received K bits are equal to one another, otherwise, $$\delta_{NEXT} = \beta \cdot \delta_{PREVIOUS}$$

wherein:

$\delta_{PREVIOUS}$ is a previous value of the step size;

$\beta$ is a constant in the range between zero and one;

K is a number greater than one;

J is a number in the range from one to K; and $\delta_{ERROR}$ has a value that is inversely proportional to an error rate associated with the group of one or more coded bits.

16. An apparatus that generates a step size for use in a continuous variable slope delta demodulator, the apparatus comprising:

logic that determines a likelihood that a group of one or more coded bits includes an erroneous bit; and logic that generates the step size as a function of the likelihood that the group of one or more coded bits includes an erroneous bit.

17. The apparatus of claim 16, wherein the logic that generates the step size as a function of the likelihood that the group of one or more coded bits includes an erroneous bit comprises:

a) logic that, if the likelihood that the group of one or more coded bits includes an erroneous bit is not greater than a threshold value, increases a previously generated step size by a first amount if J of the most recently received K bits are equal to one another, wherein K is a number greater than zero, and J is a number in the range from one to K; and b) logic that, if the likelihood that the group of one or more coded bits includes an erroneous bit is greater than the threshold value, increases the previously generated step size by a second amount if L of the most recently received M bits are equal to one another, wherein M is a number greater than zero, and L is a number in the range from one to M, wherein J, K, L and M have values such that operation of element a) increases the previously generated step size at a faster rate than does operation of element b).

18. The apparatus of claim 17, wherein:

element a) further comprises logic that reduces the step size by a third amount if J of the most recently received K bits are not equal to one another; and element b) further comprises logic that reduces the step size by a fourth amount if L of the most recently received M bits are not equal to one another.

19. The apparatus of claim 18, wherein the third amount is equal to the fourth amount.

20. The apparatus of claim 18, wherein the third amount is not equal to the fourth amount.

21. The apparatus of claim 17, wherein the first amount is equal to the second amount.

22. The apparatus of claim 17, wherein the first amount is greater than the second amount.

23. The apparatus of claim 16, wherein the logic that generates the step size as a function of the likelihood that the group of one or more coded bits includes an erroneous bit comprises:

a) logic that increases a previously generated step size by a first amount if the likelihood that the group of one or more coded bits includes an erroneous bit is not greater than a threshold value, and that otherwise increases the previously generated step size by a second amount, wherein the second amount is less than the first amount.

24. The apparatus of claim 23, wherein the second amount is equal to zero, whereby the previously generated step size is not changed.

25. The apparatus of claim 23, wherein the second amount is greater than zero.

26. The apparatus of claim 23, wherein the elements a) and b) operate only if J of the most recently received K bits are equal to one another, wherein K is a number greater than zero, and J is a number in the range from one to K, and further comprising:

logic that reduces the step size by a third amount if J of the most recently received K bits are not equal to one another.

27. The apparatus of claim 16, wherein the logic that generates the step size as a function of the likelihood that the group of one or more coded bits includes an erroneous bit comprises:

setting a next step size, $\delta_{NEXT}$, in accordance with the following:

$$\delta_{NEXT} = \delta_{PREVIOUS} + \delta_{ERROR}$$

if J of the most recently received K bits are equal to one another, otherwise, $$\delta_{NEXT}=\beta\cdot\delta_{PREVIOUS}$$

wherein:

$\delta_{PREVIOUS}$ is a previous value of the step size;

$\beta$ is a constant in the range between zero and one;

$\delta_{ERROR}$ is a number greater than zero;

K is a number greater than one;

J is a number in the range from one to K; and values for K and J are selected as a function of an error rate associated with the group of one or more coded bits.

28. The apparatus of claim 27, wherein selecting values for K and J is performed in such a way that a rate at which $\delta_{NEXT}$ increases is inversely proportional to the error rate associated with the group of one or more coded bits.

29. The apparatus of claim 27, wherein $\delta_{ERROR}$ has a value that is inversely proportional to an error rate associated with the group of one or more coded bits.

30. The apparatus of claim 16, wherein the logic that generates the step size as a function of the likelihood that the group of one or more coded bits includes an erroneous bit comprises:

logic that sets a next step size, $\delta_{NEXT}$, in accordance with the following:

$$\delta_{NEXT}=\delta_{PREVIOUS}+\delta_{ERROR}$$

if J of the most recently received K bits are equal to one another, otherwise, $$\delta_{NEXT}=\beta\cdot\delta_{PREVIOUS}$$

wherein:

$\delta_{PREVIOUS}$ is a previous value of the step size;

$\beta$ is a constant in the range between zero and one;

K is a number greater than one;

J is a number in the range from one to K; and $\delta_{ERROR}$ has a value that is inversely proportional to an error rate associated with the group of one or more coded bits.

* * * * *